United States Patent
Haripin et al.

(10) Patent No.: US 12,320,001 B2
(45) Date of Patent: Jun. 3, 2025

(54) COMPOSITIONS AND METHODS USING SAME FOR THERMAL DEPOSITION SILICON-CONTAINING FILMS

(71) Applicant: VERSUM MATERIALS US, LLC, Tempe, AZ (US)

(72) Inventors: Chandra Haripin, San Marcos, CA (US); Xinjian Lei, Vista, CA (US)

(73) Assignee: Versum Materials US, LLC, Tempe, AZ (US)

( * ) Notice: Subject to any disclaimer, the term of this patent is extended or adjusted under 35 U.S.C. 154(b) by 0 days.

(21) Appl. No.: 17/612,996

(22) PCT Filed: May 21, 2020

(86) PCT No.: PCT/US2020/033897
§ 371 (c)(1),
(2) Date: Nov. 19, 2021

(87) PCT Pub. No.: WO2020/236994
PCT Pub. Date: Nov. 26, 2020

(65) Prior Publication Data
US 2022/0213597 A1 Jul. 7, 2022

Related U.S. Application Data

(60) Provisional application No. 62/850,717, filed on May 21, 2019.

(51) Int. Cl.
*C23C 16/455* (2006.01)
*C23C 16/40* (2006.01)
*C23C 16/44* (2006.01)

(52) U.S. Cl.
CPC ...... *C23C 16/45527* (2013.01); *C23C 16/402* (2013.01); *C23C 16/4408* (2013.01)

(58) Field of Classification Search
CPC ............ C23C 16/45527; C23C 16/402; C23C 16/4408; C23C 16/45531; C23C 16/45534; C23C 16/45553; C23C 16/401; C23C 16/56
See application file for complete search history.

(56) References Cited

U.S. PATENT DOCUMENTS

| | | |
|---|---|---|
| 6,992,019 B2 | 1/2006 | Lee et al. |
| 7,084,076 B2 | 8/2006 | Park et al. |
| 2009/0232985 A1 | 9/2009 | Dussarrat et al. |
| 2013/0022496 A1 | 1/2013 | Herdt et al. |
| 2014/0051264 A1 | 2/2014 | Mallick et al. |
| 2014/0302688 A1 | 10/2014 | Underwood et al. |
| 2018/0223429 A1 | 8/2018 | Fukazawa et al. |

FOREIGN PATENT DOCUMENTS

| | | | |
|---|---|---|---|
| JP | H0766196 A | 3/1995 | |
| JP | 2002217190 A | 8/2002 | |
| JP | 2011080108 A | 4/2011 | |
| KR | 2011003045 A | 1/2011 | |
| KR | 20110003045 A | * 10/2011 | ............ C23C 16/44 |
| WO | 2004027850 A | 4/2004 | |
| WO | 11043139 A1 | 4/2011 | |
| WO | 14134476 A1 | 9/2014 | |

OTHER PUBLICATIONS

Machine translation, KR 10-2011-0003045 (Year: 2011).*
Morishita ("New substances for atomic-layer deposition of silicon dioxide", Morishita et al, Journal of Non-Crystalline Solids 187 (1995) 66-69) (Year: 1995).*
Gasser, W.Z., et al. "Quasi-monolayer deposition of silicon dioxide", Thin Solid Films, 1994, 250, 213.
Yamaguchi, K., et al., "Atomic-layer chemical-vapor-deposition of silicon dioxide films with an extremely low hydrogen content", Applied Surface Science, 1998, 130, 212.
Mayangsari, T., et al. "Catalyzed Atomic Layer Deposition of Silicon Oxide at Ultra-low Temperature Using Alkylamine".
S. Morishita et al: "New substances for atomic-layer deposition of silicon dioxide.", Journal of non-crystalline solids, vol. 187, Jul. 1, 1995 (Jul. 1, 1995), pp. 66-69, XP055754761, NL ISSN: 0022-3093.

* cited by examiner

*Primary Examiner* — Michael G Miller
(74) *Attorney, Agent, or Firm* — David K. Benson; Versum Materials US, LLC

(57) ABSTRACT

A composition is used in a process for depositing a silicon oxide film or a carbon doped silicon oxide film using a deposition process, wherein the composition includes at least one silicon precursor having a structure represented by Formula I as described herein

8 Claims, No Drawings

COMPOSITIONS AND METHODS USING SAME FOR THERMAL DEPOSITION SILICON-CONTAINING FILMS

CROSS-REFERENCE TO RELATED APPLICATIONS

This application is a National Stage filing under 35 U.S.C. 371 of International Patent Application No. PCT/US2020/033897, filed May 21, 2020, which claims priority to U.S. provisional application 62/850,717 filed on May 21, 2019. The entire contents of these applications are incorporated herein by reference, in their entirety, thereto for all allowable purposes.

BACKGROUND OF THE INVENTION

Described herein is a composition and method for the fabrication of an electronic device. More specifically, described herein are compounds, and compositions and methods comprising same, for the deposition of a silicon-containing film such as, without limitation, a silicon oxide, a carbon doped silicon oxide, a carbon doped silicon nitride, a carbon doped silicon oxynitride, or a silicon carbide film.

There is a need in the art to provide a composition and method using non-halogenated precursors and mild oxidant for depositing silicon-containing films such as silicon oxide or carbon doped silicon oxide for certain applications in semi-conductor industry.

U.S. Pat. Nos. 7,084,076 and 6,992,019 describe methods for deposition of a silicon dioxide film using atomic layer deposition (ALD), wherein a halogen- or NCO-substituted siloxane is used as a Si source.

US Publ. No. 2013/022496 teaches a method of forming a dielectric film having Si—C bonds on a semiconductor substrate by ALD, which includes: (i) adsorbing a precursor on a surface of a substrate; (ii) reacting the adsorbed precursor and a reactant gas on the surface; and (iii) repeating steps (i) and (ii) to form a dielectric film having at least Si—C bonds on the substrate.

US Publ. No. 2014/302688 describes a method for forming a dielectric layer on a patterned substrate that may include combining a silicon-and-carbon-containing precursor and a radical oxygen precursor in a plasma free substrate processing region within a chemical vapor deposition chamber. The silicon-and-carbon-containing precursor and the radical oxygen precursor react to deposit the flowable silicon-carbon-oxygen layer on the patterned substrate.

US Publ. No. 2014/302690 describes methods for forming a low-k dielectric material on a substrate. The methods may include the steps of producing a radical precursor by flowing an unexcited precursor into a remote plasma region, and reacting the radical precursor with a gas-phase silicon precursor to deposit a flowable film on the substrate. The gas-phase silicon precursor may include at least one silicon-and-oxygen containing compound and at least one silicon-and-carbon linker. The flowable film may be cured to form the low-k dielectric material.

US Publ. No. 2014/051264 describes methods of depositing initially flowable dielectric films on substrates. The methods include introducing silicon-containing precursor to a deposition chamber that contains the substrate. The methods further include generating at least one excited precursor, such as radical nitrogen or oxygen precursor, with a remote plasma system located outside the deposition chamber. The excited precursor is also introduced to the deposition chamber, where it reacts with the silicon-containing precursor in a reaction zone deposits the initially flowable film on the substrate. The flowable film may be treated in, for example, a steam environment to form a silicon oxide film.

PCT Publ. No. WO11043139 A1 describes the raw material containing tri-isocyanate silane (HSi(NCO)$_3$) for forming silicon-containing film.

PCT Publ. No. WO14134476A1 describes methods for the deposition of films comprising SiCN and SiCON. Certain methods involve exposing a substrate surface to a first and second precursor, the first precursor having a formula $(X_yH_{3-y}Si)zCH_{4-z}$, $(X_yH_{3-y}Si)(CH_2)(SiX_pH_{2-p})(CH_2)(SiX_yH_{3-y})$, or $(X_yH_{3-y}Si)(CH_2)_n(SiX_yH_{3-y})$, wherein X is a halogen, y has a value of between 1 and 3, z has a value of between 1 and 3, p has a value of between 0 and 2, and n has a value between 2 and 5, and the second precursor comprising a reducing amine. Certain methods also comprise exposure of the substrate surface to an oxygen source to provide a film comprising SiCON.

The reference entitled "Quasi-monolayer deposition of silicon dioxide", Gasser, W, Z. et al., Thin Solid Films, 1994, 250, 213 discloses SiO$_2$ films that were deposited layer by layer from a new silicon source gas, i.e. tetra-iso-cyanate-silane (Si(NCO)$_4$).

The reference entitled "Atomic-layer chemical-vapor-deposition of silicon dioxide films with an extremely low hydrogen content", Yamaguchi, K. et al, Applied Surface Science, 1998, 130, 212 discloses atomic-layer-deposition of SiO$_2$ with an extremely low H content using Si(NCO)$_4$ and N(C$_2$H$_5$)$_3$ The reference entitled "Catalyzed Atomic Layer Deposition of Silicon Oxide at Ultra-low Temperature Using Alkylamine", Mayangsari, T. et al., reported the catalyzed atomic layer deposition (ALD) of silicon oxide using Si$_2$Cl$_6$, H$_2$O, and various alkylamines.

BRIEF SUMMARY OF THE INVENTION

The composition and method described herein overcome the problems of the prior art by providing a composition or formulation for depositing a silicon-containing film forming without any halogenated precursor (i.e. chorosilane) or strong oxidizer such as oxygen plasma or ozone.

In one aspect, the deposited film is silicon oxide with impurities such as nitrogen and carbon less than 1 at. % by X-Ray Photoelectron Spectroscopy (XPS). The method involves depositing silicon oxide via thermal ALD using tetraisocyanatosilane (TiCS) and water with a catalyst.

In another particular embodiment, the composition described herein may be used in a method to deposit a carbon doped silicon oxide film using thermal ALD with carbon content in the range of 1 to 15 at. % by X-Ray Photoelectron Spectroscopy (XPS).

In one aspect, the composition for depositing a silicon-containing film comprises a silicon compound having at least one isocyanato group and represented by the following Formula I:

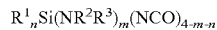

$$R^1{}_n Si(NR^2R^3)_m(NCO)_{4-m-n} \qquad I$$

wherein $R^1$ is independently selected from hydrogen, a linear $C_1$ to $C_6$ alkyl group, a branched $C_3$ to $C_6$ alkyl group, a $C_3$ to $C_6$ cyclic alkyl group, a $C_2$ to $C_6$ alkenyl group, a $C_3$ to $C_6$ alkynyl group, and a $C_4$ to $C_{10}$ aryl group; $R^2$ and $R^3$ are each independently selected from the group consisting of hydrogen, a $C_1$ to $C_6$ linear alkyl group, a branched $C_3$ to $C_6$ alkyl group, a $C_3$ to $C_6$ cyclic alkyl group, a $C_2$ to $C_6$ alkenyl group, a $C_3$ to $C_6$ alkynyl group, and a $C_4$ to $C_{10}$ aryl group, and may or may not be linked to form a cyclic ring structure; n=0, 1, or 2; and m=0, 1, 2, or 3, wherein n+m=0, 1, 2 or 3.

In another aspect, there is provided a method for depositing a film selected from a silicon oxide film and a carbon-doped silicon oxide film onto a surface of a substrate comprising:
a. placing the substrate into a reactor and heating the reactor to at least one temperature ranging from about 20° C. to about 600° C.;
b. introducing into the reactor a precursor according to Formula I above, and optionally a catalyst into the reactor;
c. purging the reactor with purge gas;
d. providing an oxygen source and optionally a catalyst into the reactor to react with the surface to form an as-deposited film wherein the catalyst comprises a Lewis base; and
e. purging reactor with purge gas;
wherein steps b through e are repeated until a desired thickness of silicon oxide or carbon doped silicon oxide is deposited on the substrate as the silicon-containing film.

DETAILED DESCRIPTION OF THE INVENTION

One embodiment of the present invention is directed to silicon compounds having at least one isocyanato group, and compositions comprising the same, for depositing a silicon-containing film such as silicon oxide, preferably having carbon or/and nitrogen contents less than 1 at. %, or carbon doped silicon oxide, preferably having a carbon content of about 1 at. % to 15 at. % as measured by XPS. Another embodiment of the present invention is directed to the film deposited using the composition, and methods described herein, which exhibits an extremely low etch rate, preferably about 0.20 Å/s or less or about 0.15 Å/s or less in dilute HF, while exhibiting variability in other tunable properties such as, without limitation, density, dielectric constant, refractive index, and elemental composition.

In one aspect, the composition for depositing the silicon-containing film comprises a silicon compound having at least one isocyanate group with the following Formula I:

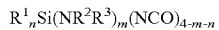

$R^1_n Si(NR^2R^3)_m (NCO)_{4-m-n}$  I wherein $R^1$ is independently selected from hydrogen, a linear $C_1$ to $C_6$ alkyl group, a branched $C_3$ to $C_6$ alkyl group, a $C_3$ to $C_6$ cyclic alkyl group, a $C_2$ to $C_6$ alkenyl group, a $C_3$ to $C_6$ alkynyl group, and a $C_4$ to $C_{10}$ aryl group; $R^2$ and $R^3$ are each independently selected from the group consisting of hydrogen, a $C_1$ to $C_6$ linear alkyl group, a branched $C_3$ to $C_6$ alkyl group, a $C_3$ to $C_6$ cyclic alkyl group, a $C_2$ to $C_6$ alkenyl group, a $C_3$ to $C_6$ alkynyl group, and a $C_4$ to $C_{10}$ aryl group, and may or may not be linked to form a cyclic ring structure; n=0, 1, or 2; and m=0, 1, 2, or 3, wherein n+m=0, 1, 2 or 3.

The silicon compound(s) having Formula I according to the present invention and compositions comprising the silicon precursor compounds having Formula I are preferably substantially free of halide. As used herein, the term "substantially free" as it relates to halide ions (or halides) such as, for example, chlorides (i.e. chloride-containing species such as HCl or silicon compounds having at least one Si—Cl bond) and fluorides, bromides, and iodides, means less than 5 ppm (by weight) measured by ion chromatography (IC) or inductively coupled plasma mass spectrometry (ICP-MS), preferably less than 3 ppm measured by IC or ICP-MS, and more preferably less than 1 ppm measured by IC or ICP-MS, and most preferably 0 ppm measured by IC or ICP-MS.

Chlorides are known to act as decomposition catalysts for the silicon compounds having Formula I. Significant levels of chloride in the final product can cause the silicon precursor compounds to degrade. The gradual degradation of the silicon compounds may directly impact the film deposition process making it difficult for the semiconductor manufacturer to meet film specifications. In addition, the shelf-life or stability is negatively impacted by the higher degradation rate of the silicon compounds having Formula I thereby making it difficult to guarantee a 1-2 year shelf-life. Therefore, the accelerated decomposition of the silicon compounds having Formula I presents safety and performance concerns related to the formation of these flammable and/or pyrophoric gaseous byproducts. The silicon compounds having Formula I are preferably substantially free of metal ions such as, $Li^+$, $Na^+$, $K^+$, $Mg^{2+}$, $Ca^{2+}$, $Al^{3+}$, $Fe^{2+}$, $Fe^{2+}$, $Fe^{3+}$, $Ni^{2+}$, $Cr^{3+}$. As used herein, the term "substantially free" as it relates to Li, Na, K, Mg, Ca, Al, Fe, Ni, Cr means less than 5 ppm (by weight), preferably less than 3 ppm, and more preferably less than 1 ppm, and most preferably 0.1 ppm as measured by ICP-MS. In some embodiments, the silicon compounds having Formula I are free of metal ions such as, $Li^+$, $Na^+$, $K^+$, $Mg^{2+}$, $Ca^{2+}$, $Al^{3+}$, $Fe^{2+}$, $Fe^{2+}$, $Fe^{3+}$, $Ni^{2+}$, $Cr^{3+}$. As used herein, the term "free of" metal impurities as it relates to Li, Na, K, Mg, Ca, Al, Fe, Ni, Cr, noble metal such as volatile Ru or Pt complexes from ruthenium or platinum catalysts used in the synthesis, means less than 1 ppm, preferably 0.1 ppm (by weight) as measured by ICP-MS or other analytical method for measuring metals. In addition, the silicon compounds having Formula I preferably have purity of 98 wt. % or higher, more preferably 99 wt. or higher as measured by GC when used as precursor to deposit the silicon-containing films.

Another embodiment of the invention includes a method of depositing a silicon oxide film having a carbon or/and nitrogen content of less than 1 at. % using at least one silicon compound having Formula I. According to a preferred embodiment one silicon precursor is tetraisocyanatosilane (TiCS), which is deposited in the presence of a catalyst and an oxygen source such as water. In this or other embodiments, the catalyst is selected from a Lewis base such as pyridine, piperazine, ammonia, or other organic amines including primary amines $H_2NR^2$, secondary amines $HNR^2R^3$, or ternary amines $R^1NR^2R^3$ wherein $R^{1-3}$ are defined as aforementioned, and $R^{1-3}$ are not hygrogen. Examples of organic amines include but are not limited to methylamine, dimethylamine, trimethylamine, ethylamine, diethylamine, triethylamine, tri-n-propylamine, and tri-isopropylamine. In some embodiments, the catalyst is delivered into the reactor using a different gasline, while in other embodiments the catalyst is pre-mixed with the oxygen source with a catalyst concentration ranging from 0.001 to 99.99 wt % and then delivered into the reactor via direct liquid injection (DLI) or bubbling or vapor draw, preferably DLI. The amount of oxygen source such as water in the catalyst is between 0.001 wt. %-99.99 wt. %.

In one embodiment of the method described herein, the silicon-containing film is deposited using a thermal ALD or cyclic CVD process. In this embodiment, the method comprises:
a. placing the substrate into a reactor and heating the reactor to one or more temperatures ranging from about 20° C. to about 600° C.;
b. introducing into the reactor a precursor comprising at least one silicon compound having at least one isocyanate groups, preferably a compound according to Formula I above, and optionally a catalyst into the reactor;

c. purging the reactor with purge gas;
d. providing an oxygen source and optionally a catalyst into the reactor to react with the surface to form an as-deposited film, wherein the catalyst comprises a Lewis base; and
e. purging reactor with purge gas;

wherein steps b through e are repeated until a desired thickness of silicon oxide or carbon doped silicon oxide is deposited on the substrate as the silicon-containing film;

optionally annealing the as-deposited film at one or more temperatures higher than the heating temperature wherein the annealing step is conducted at one or more temperatures ranging from about 400° C. to about 1000° C.;

optionally post-deposition treating the as-deposited film with an oxygen source at one or more temperatures ranging from about ambient temperature to about 1000° C., or from about 100° to 400° C., to provide a film having a higher density;

optionally exposing the as-deposited film to a UV source; and optionally post-deposition treating the processed film to a noble gas or plasma comprising hydrogen. The oxygen source is a mild oxidant, i.e. it cannot oxide substrate such as amorphous carbon and selected from the group consisting of water, hydrogen peroxide, and combination thereof.

In one particular embodiment for deposition of silicon-containing film such as pure silicon oxide having less than 1 at. % either carbon or nitrogen or both, the silicon compound is tetraisocyanatosilane containing 100 ppm of chloride or less. In another particular embodiment for deposition of silicon-containing film such as silicon oxide having less than 1 at. % either carbon or nitrogen or both, the silicon compound is a compound having at least one organoamino group selected from $Si(NR^2R^3)_m(NCO)_{4-m-n}$ wherein n=0, m=1, 2, 3 in Formula I. Exemplary compounds include but are not limited to, dimethylaminotriisocyanatosilane, diethylaminotriisocyanatosilane, ethylmethylaminotriisocyanatosilane, di-iso-propylaminotriisocyanatosilane, di-sec-butylaminotriisocyanatosilane, and pyrrolidinotriisocyanatosilane. It is believed that a silicon compound having both organoamino and isocyanato groups is more reactive than those just having isocyanato group(s), thus allowing more silicon fragments being anchored which provide higher growth rate. Yet, in another embodiment for deposition of a silicon-containing film such as carbon doped silicon oxide having a carbon content of about 1 at. % to 15 at. %, the silicon compound is selected from $MeSi(NR^2R^3)_m(NCO)_{4-m-n}$ wherein n=1, m=0, 1, 2 in Formula I.

In certain embodiments, the one or more method steps are conducted in the presence of a catalyst. In this or other embodiments, the catalyst is selected from a Lewis base such as pyridine, piperazine, ammonia, or other organic amines including primary amines $H_2NR^2$, secondary amines $HNR^2R^3$, or ternary amines $R^1NR^2R^3$ wherein $R^{1-3}$ are defined as aforementioned, and $R^{1-3}$ are not hydrogen. Examples of organic amines include but are not limited to methylamine, dimethylamine, trimethylamine, ethylamine, diethylamine, triethylamine, tri-n-propylamine, tri-iso-propylamine. In some embodiments, the catalyst is delivered into the reactor using a different gasline, in other embodiments, the catalyst is pre-mixed with the oxygen source with a catalyst concentration ranging from 0.01 ppm to 99.9 wt % and then delivered into the reactor via direct liquid injection (DLI) or bubbling or vapor draw, preferably DLI.

In the formulas above and throughout the description, the term "alkyl" denotes a linear or branched functional group having from 1 to 10 or 1 to 4 carbon atoms. Exemplary linear alkyl groups include, but are not limited to, methyl, ethyl, n-propyl, n-butyl, n-pentyl, and hexyl. Exemplary branched alkyl groups include, but are not limited to, iso-propyl, iso-butyl, sec-butyl, tert-butyl, iso-pentyl, tert-pentyl, and iso-hexyl. In certain embodiments, the alkyl group may have one or more functional groups such as, but not limited to, an alkoxy group, a dialkylamino group, or combinations thereof, attached thereto. In other embodiments, the alkyl group does not have one or more functional groups attached thereto.

In the formulas above and throughout the description, the term "cyclic alkyl" denotes a cyclic functional group having from 3 to 10 or from 4 to 10 carbon atoms. Exemplary cyclic alkyl groups include, but are not limited to, cyclobutyl, cyclopentyl, cyclohexyl, and cyclooctyl groups.

In the formulas above and throughout the description, the term "alkenyl group" denotes a group which has one or more carbon-carbon double bonds and has from 2 to 10 or from 2 to 6 carbon atoms. Exemplary alkenyl groups include, but are not limited to, vinyl or allyl groups In the formulas above and throughout the description, the term "alkynyl group" denotes a group which has one or more carbon-carbon triple bonds and has from 2 to 10 or from 2 to 6 carbon atoms.

In the formulas above and throughout the description, the term "aryl" denotes an aromatic cyclic functional group having from 4 to 10 carbon atoms, from 5 to 10 carbon atoms, or from 6 to 10 carbon atoms. Exemplary aryl groups include, but are not limited to, phenyl, benzyl, chlorobenzyl, tolyl, o-xylyl, 1,2,3-triazolyl, pyrrrolyl, and furanyl, pyridazinyl, pyrimidinyl, pyrazinyl, and imidazolyl.

As previously mentioned, the silicon-containing film is deposited upon at least a surface of a substrate such as a semiconductor substrate. In the method described herein, the substrate may be comprised of and/or coated with a variety of materials well known in the art including films of silicon, silicon oxide, silicon nitride, amorphous carbon, silicon oxycarbide, silicon oxynitride, silicon carbide, germanium, germanium doped silicon, metal such as copper, tungsten, aluminum, cobalt, nickel, tantalum), metal nitride such as titanium nitride, tantalum nitride, metal oxide, group III/V metals or metalloids such as GaAs, InP, GaP and GaN, and a combination thereof. These coatings may completely coat the semi-conductor substrate, may be in multiple layers of various materials and may be partially etched to expose underlying layers of material. The surface may also have on it a photoresist material that has been exposed with a pattern and developed to partially coat the substrate. In certain embodiments, the semiconductor substrate comprising at least one surface feature selected from the group consisting of pores, vias, trenches, and combinations thereof.

The deposition method used to form the silicon-containing films or coatings are deposition processes. Examples of suitable deposition processes for the method disclosed herein include, but are not limited to, a cyclic chemical vapor deposition or an atomic layer deposition process. As used herein, the term "cyclic chemical vapor deposition processes" refers to any process wherein a substrate is exposed to one or more volatile precursors, which react and/or decompose on the substrate surface to produce the desired deposition. As used herein, the term "atomic layer deposition process" refers to a self-limiting (e.g., the amount of film material deposited in each reaction cycle is constant), sequential surface chemistry that deposits films of materials onto substrates of varying compositions. Although the precursors, reagents and sources used herein may be sometimes described as "gaseous", it is understood that the precursors can be either liquid or solid which are transported with or without an inert gas into the reactor via direct vaporization, bubbling or sublimation. In some case, the vaporized precursors can pass through a plasma generator.

In one embodiment, the silicon-containing film is deposited using an ALD process. In another embodiment, the silicon-containing film is deposited using a CCVD process. In a further embodiment, the silicon-containing film is deposited using a thermal ALD process. The term "reactor" as used herein, includes without limitation, reaction chamber or deposition chamber.

In certain embodiments, the method disclosed herein avoids pre-reaction of precursor(s) by using ALD or CCVD methods that separate the precursor(s) prior to and/or during the introduction to the reactor. In this connection, deposition techniques such as ALD or CCVD processes are used to deposit the silicon-containing film. In one embodiment, the film is deposited via an ALD process in a typical single wafer ALD reactor, semi-batch ALD reactor, or batch furnace ALD reactor by exposing the substrate surface alternatively to the one or more the silicon-containing precursor, oxygen source, nitrogen-containing source, or other precursor or reagent. Film growth proceeds by self-limiting control of surface reaction, the pulse length of each precursor or reagent, and the deposition temperature. However, once the surface of the substrate is saturated, the film growth ceases. In another embodiment, each reactant including the silicon and reactive gas is exposed to a substrate by moving or rotating the substrate to different sections of the reactor and each section is separated by inert gas curtain, i.e. spatial ALD reactor or roll to roll ALD reactor.

Depending upon the deposition method, in certain embodiments, the silicon precursors described herein and optionally other silicon-containing precursors may be introduced into the reactor at a predetermined molar volume, or from about 0.1 to about 1000 micromoles. In this or other embodiments, the precursor may be introduced into the reactor for a predetermined time period. In certain embodiments, the time period ranges from about 0.001 to about 500 seconds.

In certain embodiments, the silicon-containing films deposited using the methods described herein are formed in the presence of oxygen using an oxygen source, reagent or precursor comprising oxygen. An oxygen source may be introduced into the reactor in the form of at least one oxygen source and/or may be present incidentally in the other precursors used in the deposition process. Suitable oxygen source gases may include, for example, water ($H_2O$) (e.g., deionized water, purified water, distilled water, water vapor, water vapor plasma, oxygenated water, a composition comprising water and other organic liquid such as organoamine as catalyst, hydrogen peroxide, and combinations thereof. In certain embodiments, the oxygen source comprises an oxygen source gas that is introduced into the reactor at a flow rate ranging from about 1 to about 2000 square cubic centimeters (sccm) or from about 1 to about 1000 sccm. The oxygen source can be introduced for a time that ranges from about 0.1 to about 100 seconds.

In embodiments wherein the film is deposited by an ALD or a cyclic CVD process, the precursor pulse can have a pulse duration that is greater than 0.01 seconds, and the oxygen source can have a pulse duration that is less than 0.01 seconds, while the water pulse duration can have a pulse duration that is less than 0.01 seconds.

In certain embodiments, the oxygen source is continuously flowing into the reactor while precursor pulse and plasma are introduced in sequence. The precursor pulse can have a pulse duration greater than 0.01 seconds while the plasma duration can range between 0.01 seconds to 100 seconds.

In certain embodiments, the one or more method steps are conducted in the presence of a catalyst. In this or other embodiments, the catalyst is selected from a Lewis base such as pyridine, piperazine, ammonia, or other organic amines.

The deposition methods disclosed herein may involve one or more purge gases. The purge gas, which is used to purge away unconsumed reactants and/or reaction byproducts, is an inert gas that does not react with the precursors. Exemplary purge gases include, but are not limited to, argon (Ar), nitrogen ($N_2$), helium (He), neon, hydrogen ($H_2$), and combinations thereof. In certain embodiments, a purge gas such as Ar is supplied into the reactor at a flow rate ranging from about 10 to about 2000 sccm for about 0.1 to 1000 seconds, thereby purging the unreacted material and any byproduct that may remain in the reactor.

The respective step of supplying the silicon precursors, oxygen source, the nitrogen-containing source, and/or other precursors, source gases, and/or reagents may be performed by changing the time for supplying them to change the stoichiometric composition of the resulting film.

In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively a remote plasma-generated process in which plasma is generated outside of the reactor and supplied into the reactor.

The silicon precursors and/or other silicon-containing precursors may be delivered to the reaction chamber, such as a CVD or ALD reactor, in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, MN, to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

In this or other embodiments, it is understood that the steps of the methods described herein may be performed in a variety of orders, may be performed sequentially or concurrently (e.g., during at least a portion of another step), and any combination thereof. The respective step of supplying the precursors and the nitrogen-containing source gases may be performed by varying the duration of the time for supplying them to change the stoichiometric composition of the resulting silicon-containing film.

In a still further embodiment of the method described herein, the film or the as-deposited film is subjected to a treatment step. The treatment step can be conducted during at least a portion of the deposition step, after the deposition step, and combinations thereof. Exemplary treatment steps include, without limitation, treatment via high temperature thermal annealing; plasma treatment; ultraviolet (UV) light treatment; laser; electron beam treatment and combinations thereof to affect one or more properties of the film. The films deposited with the silicon precursors described herein, when compared to films deposited with previously disclosed silicon precursors under the same conditions, have improved properties such as, without limitation, a wet etch rate that is lower than the wet etch rate of the film before the treatment step or a density that is higher than the density prior to the treatment step. In one particular embodiment, during the deposition process, as-deposited films are intermittently treated. These intermittent or mid-deposition treatments can be performed, for example, after each ALD cycle, after a certain number of ALD cycles, such as, without limitation, two (2) ALD cycles, five (5) ALD cycles, or after every ten (10) or more ALD cycles.

In an embodiment wherein the silicon-containing film is treated with a high temperature annealing step, the annealing temperature is at least 100° C. or greater than the deposition temperature. In this or other embodiments, the annealing temperature ranges from about 400° C. to about 1000° C. In this or other embodiments, the annealing treatment can be conducted in a vacuum (<760 Torr) in inert environment or oxidizing environment In an embodiment wherein the silicon-containing film is treated to UV treatment, film is exposed to broad band UV or, alternatively, an UV source having a wavelength ranging from about 150 nanometers (nm) to about 400 nm. In one particular embodiment, the as-deposited film is exposed to UV in a different chamber than the deposition chamber after a desired film thickness is reached.

In an embodiment wherein the silicon-containing film is treated with a plasma, the plasma source is selected from the group consisting of nitrogen plasma, plasma comprising nitrogen and helium, plasma comprising nitrogen and argon, ammonia plasma, plasma comprising ammonia and helium, plasma comprising ammonia and argon, helium plasma, argon plasma, neon plasma, hydrogen plasma, plasma comprising hydrogen and helium, plasma comprising hydrogen and argon, an organic amine plasma, an organic diamine plasma, and combinations thereof. In one particular embodiment, the plasma comprises an inert gas selected from the group consisting of helium, neon, argon, krypton and combinations thereof.

In another embodiment the silicon-containing film is treated chemically with alkylaminosilane having the general formula $R^1R^2NSiR^3R^4R^5$ wherein $R^{1-3}$ are defined as previously and $R^{4-5}$ are independently selected from hydrogen, a linear $C_1$ to $C_6$ alkyl group, a branched $C_3$ to $C_6$ alkyl group. Examples are dimethylaminotrimethylsilane, diethyaminotrimethylsilane, dimethylaminotriethylsilane, diisopropylaminotrimethylsilane, diisopropylaminosilane, disecbutylaminosilane.

EXAMPLES

General Film Deposition Example

Film depositions were performed in a lab scale thermal atomic layer deposition (ALD) reactor using a silicon compound having at least one isocyanato group and an oxygen source. Tetraisocyanatosilane (TiCS) was employed as the silicon precursor and water, triethylamine (TEA) or combination of the two as the oxygen source. Optionally, water was mixed with triethylamine (TEA) prior to being introduced into the reactor. The container having TiCS was heated to 50° C. while the oxygen source was delivered at room temperature. Both TiCS and oxygen source were delivered using vapor draw. The ALD cycle steps and process conditions are provided in the following Table I:

TABLE I

| Thermal ALD Process | | |
| --- | --- | --- |
| Step | Process | Parameters |
| 1. | Insert substrate samples into deposition reactor | |
| 2. | Heat samples to desired temperature | T = 50 to 250° C. |
| 3. | Close throttle valve to isolate chamber | |
| 4. | Flow Si precursor | time = 120-180 s |
| 5. | Open throttle valve | |
| 6. | Purge with nitrogen | Flow = 5 LPM<br>Time = 10 s |
| 7. | Evacuate reactor to base pressure | |
| 8. | Flow oxygen source | Chamber pressure controlled at 3 Torr<br>Time = 120-180 s |
| 9. | Purge with nitrogen | Flow = 5 LPM<br>Time = 10 s |
| 10. | Evacuate reactor to base pressure | |
| 11. | Take samples out from deposition reactor | |

Steps 4-9 were repeated multiple times to get desired thickness. The film thicknesses were measured using Filmtek 3000 PAR SE ellipsometer from Scientific Computing International (SCI).

Comparative Example 1. Deposition of Silicon-Containing Film Using Tetraisocyanatosilane (TiCS) and Water Deposition of silicon-containing film was performed using TiCS as silicon precursor and water as oxygen source using conditions in Table I at 50-150° C. substrate temperatures. The substrate used was silicon coupons with native oxide. TiCS flow was set to 180 s and water flow at 120 s. The ALD steps were repeated 100 times. Film growth per cycle (GPC), being the deposited film thickness after performing a cycle of steps 4 to 9 in Table I at different temperatures, is listed in Table II:

TABLE II

| Silicon-containing film GPC from tetraisocyanatosilane (TiCS) and water at different temperatures | | |
| --- | --- | --- |
| Deposition Temperature (° C.) | Deposited Thickness (Å) | GPC (Å/cycle) |
| 1   50 | 134 | 1.34 |
| 2   100 | 8 | 0.08 |
| 3   150 | 0 | 0.00 |

Film growth is relatively high at 50° C. and shows very little/no growth at higher temperatures.

Comparative Example 2. Deposition of Silicon-Containing Film Using TiCS and Triethylamine Deposition of a silicon-containing film was performed using TiCS as silicon precursor and triethylamine as a catalyst using steps described above at 150° C. substrate temperature. Water content in triethylamine was 80 ppm. The substrate used was silicon coupons with native oxide. TiCS flow was set to 120 s and triethylamine flow at 120 s. The ALD steps were repeated 100 times. Film thickness of 31 Å was obtained to provide GPC of 0.31 Å/cycle.

Example 1 Deposition of Silicon-Containing Film Using TiCS and Water/Triethylamine Deposition of silicon-containing film was performed using TiCS as silicon precursor and water as an oxygen source at 150° C. substrate temperature, wherein water was mixed with a catalyst. The substrate used was silicon coupons with native oxide. Triethylamine was selected as the catalyst. The water with concentration of 1% wt. was mixed with dry triethylamine in a container prior to deposition. Deposition was performed according to steps described in Table I. The ALD steps were repeated 100 times to provide a film thickness of 90 Å with a GPC of 0.90 Å/cycle, demonstrating that a combination of water and triethylamine as a catalyst boosts GPC significantly.

Example 2. Deposition of Silicon-Containing Films Using TiCS and Water/Triethylamine Deposition of silicon-containing film was performed using TiCS as a silicon precursor and water as an oxygen source, wherein water was mixed with a catalyst. Triethylamine was selected as the catalyst. In the experiment, water with concentrations ranging between 80 ppm and 10% by weight was mixed into triethylamine container prior to deposition. The substrate used was silicon coupons with native oxide. Deposition temperature was set to 150° C. TiCS flow was set to 120 s and triethylamine/water solution flow at 120 s. The ALD steps were repeated 100 times to get desired film thickness for metrology. Film thickness with various water concentration is tabulated on Table III.

TABLE III

Silicon-containing film GPC from tetraisocyanatosilane (TiCS) and triethylamine with various concentration of water at 150° C.

| Water Concentration (% wt.) | Film GPC (Å/cycle) |
| --- | --- |
| 10. | 0.82 |
| 1. | 0.81 ± 0.15 |
| 0.1 | 0.81 |
| 8.E-03 | 0.31 |

Table III clearly reveals higher film growth (i.e. higher film GPC) at a higher water concentration (>80 ppm). The GPC at 80 ppm water concentration in triethylamine is 0.3 Å/cycle while a higher concentration of water i.e. >0.1 wt. % in triethylamine provides a silicon-containing film with a GPC of about 0.8 Å/cycle.

The invention claimed is:

1. A process of depositing a silicon-containing film onto a substrate, which comprises:
   a) providing a substrate in a reactor;
   b) introducing into the reactor at least one silicon compound having at least one isocyanato group having the following Formula I:

$R^1{}_n Si(NR^2R^3)_m(NCO)_{4-m-n}$     I wherein $R^1$ is independently selected from hydrogen, a linear $C_1$ to $C_6$ alkyl group, a branched $C_3$ to $C_6$ alkyl group, a $C_3$ to $C_6$ cyclic alkyl group, a $C_2$ to $C_6$ alkenyl group, a $C_3$ to $C_6$ alkynyl group, and a $C_4$ to $C_{10}$ aryl group; $R^2$ and $R^3$ are each independently selected from the group consisting of hydrogen, a $C_1$ to $C_6$ linear alkyl group, a branched $C_3$ to $C_6$ alkyl group, a $C_3$ to $C_6$ cyclic alkyl group, a $C_2$ to $C_6$ alkenyl group, a $C_3$ to $C_6$ alkynyl group, and a $C_4$ to $C_{10}$ aryl group, and may or may not be linked to form a cyclic ring structure; n=0, 1, or 2; and m=0, 1, 2, or 3, wherein n+m=0, 1, 2 or 3;
   c) purging the reactor with purge gas;
   d) introducing into the reactor a mixture of an oxygen source and an amine catalyst to react with the at least one silicon compound and produce the silicon oxide film; and
   e) purging reactor with purge gas;
   wherein steps b through e are repeated until a desired thickness of the silicon oxide film is deposited onto the substrate, wherein the process is conducted at one or more temperatures ranging from 20 to 600° C. and one or more pressures ranging from 50 miliTorr (mT) to 760 Torr.

2. The process of claim 1, wherein the oxygen source is selected from the group consisting of water vapor, hydrogen peroxide, and mixtures thereof.

3. The process of claim 1, wherein the silicon-containing film is a silicon oxide or carbon doped silicon oxide film.

4. The process of claim 1, wherein the amine catalyst is selected from the group consisting of pyridine, piperazine, ammonia, primary amines $H_2NR^2$, secondary amines $HNR^2R^3$, and ternary amines $R^1NR^2R^3$ wherein $R^{1-3}$ are defined as in claim 1, and $R^{1-3}$ are not hydrogen.

5. The process of claim 4, wherein the amine catalyst is selected from the group consisting of methylamine, dimethylamine, trimethylamine, ethylamine, diethylamine, triethylamine, tri-n-propylamine, and tri-iso-propylamine.

6. The process of claim 1, wherein the at least one silicon compound is selected from Formula I wherein n=0.

7. The process of claim 6, wherein the at least one silicon compound is selected from the group consisting of dimethylaminotriisocyanatosilane, diethylaminotriisocyanatosilane, di-iso-propylaminotriisocyanatosilane, di-sec-butylaminotriisocyanatosilane, pyrrolidinotriisocyanatosilane and tetraisocyanatosilane.

8. The process of claim 1, wherein in the at least one silicon compound having Formula I wherein $R^1$ is methyl and n=1.

\* \* \* \* \*